US 9,620,685 B2

(12) United States Patent
Yoshimizu et al.

(10) Patent No.: US 9,620,685 B2
(45) Date of Patent: Apr. 11, 2017

(54) SURFACE MOUNT LIGHT-EMITTING DEVICE (71) Applicant: Stanley Electric Co., Ltd., Tokyo (JP)

(72) Inventors: Kazuyuki Yoshimizu, Tokyo (JP); Masayuki Hasegawa, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/753,659

(22) Filed: Jun. 29, 2015

(65) Prior Publication Data

US 2016/0027968 A1    Jan. 28, 2016

(30) Foreign Application Priority Data

Jul. 25, 2014   (JP) ................................. 2014-151663

(51) Int. Cl.

| H01L 33/00 | (2010.01) |
|---|---|
| H01L 33/48 | (2010.01) |
| H01L 33/58 | (2010.01) |
| H01L 33/62 | (2010.01) |
| H01L 51/50 | (2006.01) |

(52) U.S. Cl.
CPC ............ *H01L 33/486* (2013.01); *H01L 33/58* (2013.01); *H01L 33/62* (2013.01); *H01L 51/50* (2013.01); *H01L 2224/48091* (2013.01); *H01L 2224/48247* (2013.01)

(58) Field of Classification Search
CPC .................................................. H01L 33/486
See application file for complete search history.

(56) References Cited

U.S. PATENT DOCUMENTS

| 8,860,047 B2 | 10/2014 | Morimoto |
| 8,860,061 B2 | 10/2014 | Kotani |
| 2007/0235845 A1 | 10/2007 | Xuan et al. |

(Continued)

FOREIGN PATENT DOCUMENTS

| DE | 10 2006 035 635 A1 | 2/2008 |
| EP | 2 650 590 A2 | 10/2013 |

(Continued)

OTHER PUBLICATIONS

The extended European Search Report for the related European Patent Application No. 15177317.3 dated Oct. 20, 2015.

*Primary Examiner* — William Harriston
(74) *Attorney, Agent, or Firm* — Kenealy Vaidya LLP (57) ABSTRACT

A surface mount light-emitting device of side view and lead frame type can include a casing having a cavity, a first lead frame having a first mounting surface exposed from the cavity, and a second lead frame having a second mounting surface exposed from the cavity. A light-emitting chip can be mounted on one of the first and the second mounting surfaces, which extend in a substantially same level and balanced shapes with respect to each other to be used as external electrodes. An encapsulating resin including at least one phosphor can also encapsulate the light-emitting chip in the cavity. Thus, the disclosed subject matter can provide reliable surface mount light-emitting devices that can be easily mounted on a mounting board with high positional accuracy and can emit various color lights having a high light-emitting intensity using a high brightness chip in a substantially parallel direction to the mounting board.

12 Claims, 9 Drawing Sheets

(56) References Cited

U.S. PATENT DOCUMENTS

| | | | | |
|---|---|---|---|---|
| 2008/0230790 | A1* | 9/2008 | Seko | H01L 33/486 257/89 |
| 2010/0073907 | A1 | 3/2010 | Wanninger et al. | |
| 2010/0264450 | A1* | 10/2010 | Norfidathul | H01L 33/62 257/99 |

FOREIGN PATENT DOCUMENTS

| | | |
|---|---|---|
| JP | 58-225673 A | 12/1983 |
| JP | 2013-219357 A | 10/2013 |

* cited by examiner

SURFACE MOUNT LIGHT-EMITTING DEVICE

This application claims the priority benefit under 35 U.S.C. §119 of Japanese Patent Application No. 2014-151663 filed on Jul. 25, 2014, which is hereby incorporated in its entirety by reference.

BACKGROUND

1. Field

The presently disclosed subject matter relates to surface mount light-emitting devices, and more particularly to side view type and lead frame type surface mount light-emitting devices having high reliability, which is easy to be mounted on a mounting board with high positional accuracy, and which can enjoy a high radiation performance even when the devices emit various color lights including substantially white light having a high light-emitting intensity.

2. Description of the Related Art

Surface mount light-emitting devices are used for semiconductor light-emitting devices such as an LED and the like because the devices may be miniaturized and also may be easy to be mounted directly on a mounting board along with other parts. In the surface mount light-emitting devices, side view type surface mount light-emitting devices, which may emit light in a substantially parallel direction to the mounting board, are frequently used as a light source for LCD back light units in mobile phones, smart phones, digital video cameras, PDAs, etc.

In addition, because it is desired for the side view type semiconductor light-emitting devices to emit various color lights having a high light-emitting intensity in view of the above-described applications being expanded from small size usage to larger size usages such as in general lighting and vehicle lamp lighting, demand has increased for lead frame type surface mount light-emitting devices that can be used for a high light-emitting intensity type apparatus and/or a wide-screen apparatus. Accordingly, side view type and lead frame type surface mount light-emitting devices, which can emit various color lights having a high light-emitting intensity, have been developed.

Figure 8:
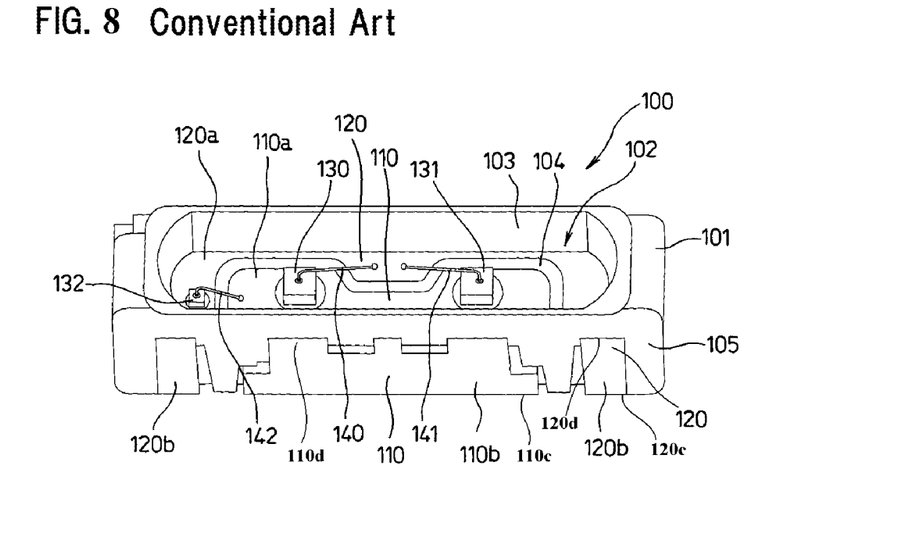
FIG. 8 is an enlarged perspective view depicting a conventional side view and lead frame type semiconductor light-emitting device.

However, because high light-emitting intensity type devices are generally driven by a large current, their rated wattages and heating values become large, and also the high light-emitting intensity type devices are frequently used under a harsh environment such as high temperature and high humidity and the like, especially when they are used for vehicle lamps, outdoor lighting, etc. Hence, a conventional side view type light-emitting package and a lead frame type light-emitting device using the package, which may improve a radiation performance and the like, are disclosed in Patent Document No. 1 (Japanese Patent Application Laid Open JP2013-219357). FIG. 8 is an enlarged perspective view depicting a conventional side view and lead frame type light-emitting device, which is disclosed in patent document No. 1.

The conventional light-emitting device 100 includes: a package 101 having a cavity 102, an inner side surface 103, an inner bottom surface 104 and an outer bottom surface 105 made from a resin such as an epoxy resin and the like; and a first lead frame 110 having a first mounting surface 110a, a first external electrode 110b, a first electrode end 110c and a first electrode bending portion 110d passing through the package 110, the first mounting surface 110a exposed from the inner bottom surface 104 in the cavity 102 of the package 101, the first external electrode 110b projecting from the package 101, bending along the outer bottom surface 105 of the package 101 via the first electrode bending portion 110d, and extending along the outer bottom surface 105 toward the inner bottom surface 104 of the package 101, the first electrode end 110c being a cutting surface of a multifaceted first lead frame to improve a productivity of the device 100.

In addition, the conventional light-emitting device 100 also include: a second lead frame 120 having a second mounting surface 120a, a second external electrode 120b, a second electrode end 120c and a second electrode bending portion 120d passing through the package 101, the second mounting surface 120a exposed from the inner bottom surface 104 in the cavity 102 of the package 101, the second external electrode 120b projecting from the package 101, bending along the outer bottom surface 105 of the package 101 via the second electrode bending portion 120d, and extending along the outer bottom surface 105 toward the inner bottom surface 104 of the package 101, the second electrode end 120c being cutting surfaces of a multifaceted second lead frame to improve a productivity of the device 100; semiconductor light-emitting chips 130 and 131 each having a bottom electrode and a top electrode mounted on the first mounting surface 110a of the first lead frame 110, the bottom electrodes thereof being electrically connected to the first lead frame 110, and each of the top electrodes thereof being electrically connected to the second mounting surface 120a of the second lead frame 120 via bonding wires 140 and 141, respectively; and a zener diode 132 having a bottom electrode and a top electrode mounted on the second mounting surface 120a of the second lead frame 120, the bottom electrode thereof being electrically connected to the second lead frame 110, and the top electrodes thereof being electrically connected to the first mounting surface 110a of the first lead frame 110 via a bonding wire 142.

When manufacturing the conventional light-emitting device 100 of the side view and lead frame type having such a structure, an insert molding method may be employed by inserting the multiple first lead frame and the multiple second lead frame into a mold tool, which molds a multiple package, so that the light-emitting device 100 integrates the first and the second lead frames 110 and 120 into the package 101 to improve the productivity thereof. Then, each of the first and the second lead frames 110 and 120 may be cut and may be bended in the above-described shape. Thereby, for example, 100 pieces of the package 101 integrating the first and the second lead frames 110 and 120 may be made at once.

Figure 9A:
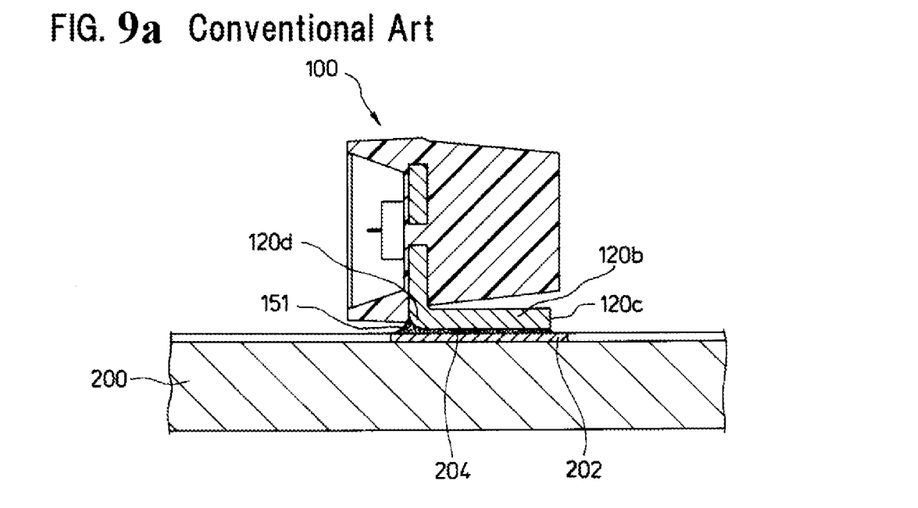
FIGS. 9a and 9b are a right side cross-sectional view and a left side cross-sectional view depicting the conventional light-emitting device shown in FIG. 8 mounted on a mounting board, respectively.
Figure 9B:
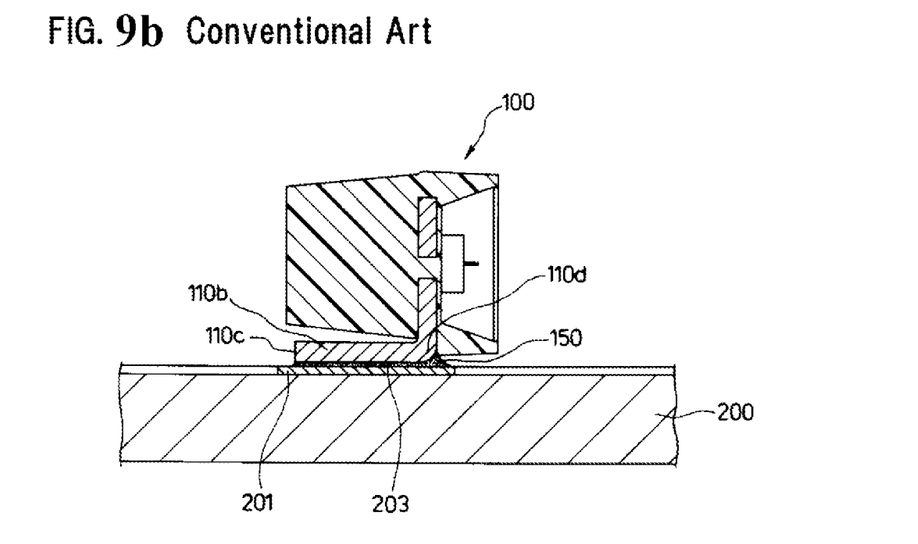

FIGS. 9a and 9b are a right side cross-sectional view and a left side cross-sectional view depicting the light-emitting device 100 shown in FIG. 8 mounted on a mounting board 200, in which a first conductor pattern 201 and a second conductor pattern 202 are formed on the mounting board 200 to mount the device 100, respectively. The conventional light-emitting device 100 may be mounted on the mounting board 200 by soldering between the first conductor pattern 201 of the mounting board 200 and the first external electrode 110b of the first lead frame 110 and between the second conductor pattern 202 of the mounting board 200 and the second external electrode 120b of the second lead frame 120.

In this case, each soldering surface of the first external electrode 110b of the first lead frame 110 and the second external electrode 120b of the second lead frame 120 may be coated with thin coating to improve each of soldering intensities between the first conductor pattern 201 of the mounting board 200 and the first external electrode 110b of the first lead frame 110 and between the second conductor pattern 202 of the mounting board 200 and the second external electrode 120b of the second lead frame 120. However, it may be almost impossible for each of the first electrode end 110c of the first lead frame 110 and the second electrode end 120c of the second lead frame 120 to coat the thin coating, because each of the first electrode end 110c and the second electrode end 120c may become the cut surface of the multiple first lead frame and the multiple second lead frame, respectively.

Accordingly, a soldering fillet may not be formed at each of the first electrode end 110c of the first lead frame 110 and the second electrode end 120c of the second lead frame 120, although soldering fillets 150 and 151 may be formed at each of the first electrode bending portion 110d of the first lead frame 110 and the second electrode bending portion 120d of the second lead frame 120 as shown in FIG. 9b and FIG. 9a, respectively. Therefore, a positional accuracy of the conventional light-emitting device 100 with reference to the mounting board 200 may be subject to a degradation due to a difference between amounts of a first solder 203 melted between the first conductor pattern 201 of the mounting board 200 and the first external electrode 110b of the first lead frame 110 and a second solder 204 melted between the second conductor pattern 202 of the mounting board 200 and the second external electrode 120b of the second lead frame 120, etc.

In addition, a radiation performance of the conventional light-emitting device 100 may also degrade because of a difference between the soldering intensities of the first and the second solders 203 and 204. The degradations may cause a decrease of a reliability of the conventional light-emitting device 100 in operation on the mounting board 200, and also may cause a decrease of a light-emitting-directional accuracy of light emitted from the conventional light-emitting device 100.

The above-referenced Patent Document and additional Patent Documents are listed below, and are hereby incorporated with their English abstracts in their entireties.
1. Patent Document No. 1: Japanese Patent Application Laid Open JP2013-219357
2. Patent Document No. 2: U.S. Pat. No. 8,860,047
3. Patent Document No. 3: U.S. Pat. No. 8,860,061

The disclosed subject matter has been devised to consider the above and other problems and characteristics. Thus, embodiments of the disclosed subject matter can include side view and lead frame type surface mount light-emitting devices, which can be easily mounted on a mounting board with high positional accuracy, and which can emit various color lights including substantially white light having a high light-emitting intensity in a substantially parallel direction to the mounting board. In addition, the embodiments of the disclosed subject matter can also include reliable side view and lead frame type surface mount light-emitting devices have high radiation performance even when emitting the various color lights having the high light-emitting intensity.

SUMMARY

The presently disclosed subject matter has been devised in view of the above and other characteristics, desires, and problems in the conventional art, and to make certain changes to the existing light sources. An aspect of the disclosed subject matter includes providing reliable surface mount light-emitting devices using a light-emitting body integrating a pair of lead frames into a casing, in which each of the lead frames can extend as a pair of electrodes underneath a bottom surface of the casing from both sides and a middle portion of the casing in a rear direction of the casing in a fine balance on a mounting board, and a semiconductor light-emitting chip can be mounted on one of the lead frames along with an encapsulating resin including at least one phosphor. Thus, the surface mount light-emitting devices can be easily mounted on the mounting board with high positional accuracy and also can emit various color lights having a high light-emitting intensity using a high brightness chip in a substantially parallel direction to the mounting board.

According to the aspect of the disclosed subject matter, a surface mount light-emitting device can include: a casing having a cavity being concave from a front surface therefore, made of a casting resin and including an imaginary vertical surface; a semiconductor light-emitting chip having at least one top electrode, and an optical axis thereof substantially located on the imaginary vertical surface; and a first lead frame having a first mounting portion inserted into the casing and a pair of first external portions projecting from the casing, the first mounting portion including a first mounting surface exposed from the cavity, the first mounting surface mounting the semiconductor light-emitting chip thereon, intersecting both the optical axis of the light-emitting chip and the imaginary vertical surface at a substantially right angle, the pair of first external portions each including a first extending portion, a first extending bottom surface located underneath the first extending portion and a first cutout section included in each of the first extending portions, and each of the first extending bottom surfaces being located in a substantially parallel direction with the optical axis and in an opposite direction of a light-emitting direction of the device, and being formed in a substantially symmetric shape with respect to each other with reference to the imaginary vertical surface.

In addition, the surface mount light-emitting device can also include: a second lead frame having a second mounting portion inserted into the casing and a second external portions projecting from the casing, the second mounting portion including a second mounting surface exposed from the cavity, the second mounting surface electrically connected to the top electrode of the light-emitting chip via a bonding wire, the second external portion including a second extending portion and a second extending bottom surface located underneath the second extending portion, and the second extending bottom surface located in the substantially parallel direction with the optical axis and in the opposite direction of the light-emitting direction of the device, and being substantially same level as the first extending bottom surfaces of the first lead frame, wherein a space of the first lead frame is located between the first mounting portion and the second mounting portion of the second lead frame; and a lens having a central axis being located adjacent the front surface of the casing, the central axis thereof intersecting with the optical axis at the substantially right angle, and extending in a direction substantially perpendicular to the imaginary vertical surface.

As an exemplary variation of the above-described exemplary surface mount light-emitting device, the semiconductor light-emitting chip can be mounted on the second mounting surface of the second lead frame and the top electrode thereof can be electrically connected to the first mounting surface of the first lead frame. Correspondingly, each shape of the first lead frame and the second lead frame can be varied to efficiently radiate a heat generated from the light-emitting chip. For example, each of the second mounting portion and the second external portion of the second lead frame can be formed in a larger shape than each of these in the above-described exemplary surface mount light-emitting device.

In the above-described exemplary surface mount light-emitting devices, the lens can include a cylindrical lens so that the device can provide a desired light distribution, and also can include a pair of projecting portions that project toward the casing, which includes a pair of concave portions from the front surface of the casing, and thereby each of the pair of projecting portions of the lens can be inserted into a respective one of the pair of concave portions of the casing to improve a positional accuracy of the lens. Additionally, each of the first lead frame and the second lead frame can be substantially symmetric with respect to the imaginary vertical surface of the casing, and also can include at least one hole so that the casting resin of the casing is inserted into the at least one hole, in order for the device to be mounted on a mounting board with high positional accuracy and to enjoy a high radiation performance.

Moreover, the above-described exemplary surface mount light-emitting devices can further include an encapsulating resin to encapsulate the light-emitting chip and the bonding wire in the cavity, and the encapsulating resin can include at least one of a red phosphor, a green phosphor, a blue phosphor and a yellow phosphor in order for the device to emit various color lights including substantially white color light. In these cases, the lens can be removed by using a top surface of the encapsulating resin as a light-emitting surface of the device, because the encapsulating resin can protect the light-emitting chip and the bonding wire from an external environment.

According to the exemplary surface mount light-emitting devices, each of the pair of first extending bottom surfaces of the first lead frame mounting the light-emitting chip on the first mounting surface can be located in the substantially parallel direction with the optical axis of the light-emitting chip, and can be formed in the substantially symmetric shape with respect to each other with reference to the imaginary vertical surface. Additionally, the second extending bottom surface located between the pair of first extending bottom surfaces can be also located in the substantially parallel direction with the optical axis, and can be a substantially same level as the first extending bottom surfaces. Thus, the disclosed subject matter can provide reliable surface mount light-emitting devices that can be easily mounted on a mounting board with high positional accuracy and can emit various color lights having a high light-emitting intensity using a high brightness chip in the substantially parallel direction to the mounting board.

BRIEF DESCRIPTION OF THE DRAWINGS

These and other characteristics and features of the disclosed subject matter will become clear from the following description with reference to the accompanying drawings, wherein:

FIG. 4b is a partial enlarged front view depicting a soldering state between the first lead frame of the device and a first conductor pattern of the circuit board in Circle C shown in FIG. 4a;

FIG. 5b is a partial enlarged side cross-sectional view depicting a soldering state between the first lead frame of the device and the first conductor pattern of the circuit board in Circle D shown in FIG. 5a;

DETAILED DESCRIPTION OF EXEMPLARY EMBODIMENTS

Figure 1A:
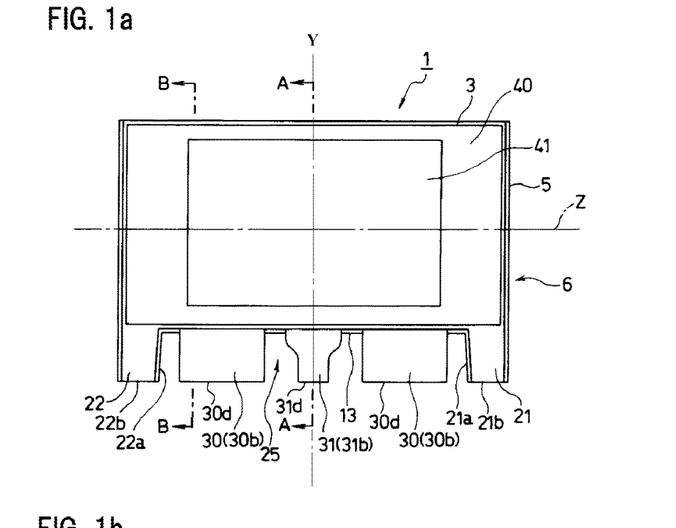
FIG. 1a is an enlarged front view showing an exemplary embodiment of a surface mount light-emitting device made in accordance with principles of the disclosed subject matter.
Figure 1B:
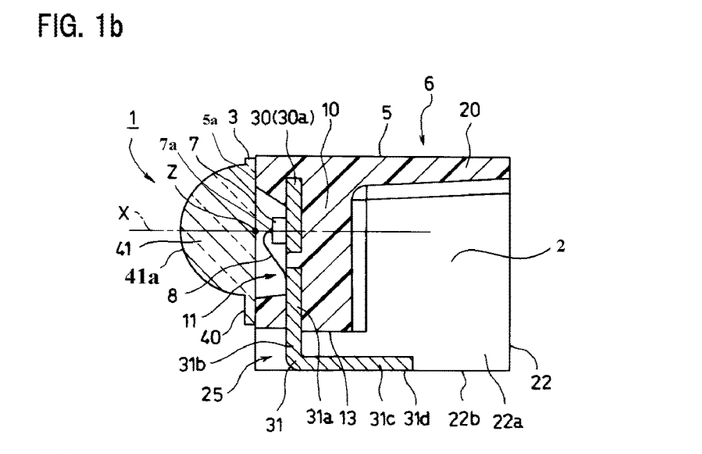
FIGS. 1b and 1c are side cross-sectional views showing the surface mount light-emitting device taken along A-A and B-B shown in FIG. 1a, respectively.
Figure 1C:
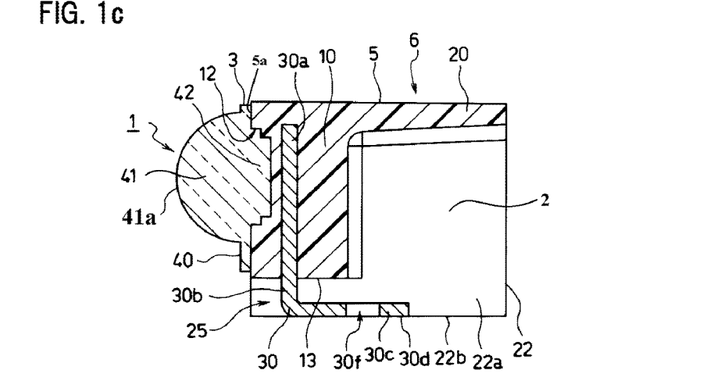

The disclosed subject matter will now be described in detail with reference to FIG. 1a to FIG. 7d. FIG. 1a is an enlarged front view showing an exemplary embodiment of a surface mount light-emitting device made in accordance with principles of the disclosed subject matter, and FIGS. 1b and 1c are side cross-sectional views showing the surface mount light-emitting device taken along A-A and B-B shown in FIG. 1a, respectively.

The surface mount light-emitting device 1 can include: a light-emitting body 2 including a casing 5 having a front surface 5a, a cavity 11 and a pair of concave portions 12, which is made of a casting resin, and the cavity 11 and the pair of concave portions 12, which are concave from the front surface 5a of the casing 5, respectively; a first lead frame 30 having a first mounting portion 30a inserted into the casing 5 and a pair of first external portions 30b projecting from the casing 5, and the pair of first external portion 30b each including a first extending portion 30c, a first extending bottom surface 30d and a first cutout section 30f; a second lead frame 31 having a second mounting portion 31a inserted into the casing 5 and a second external portion 31b projecting from the casing 5, and the second external portion 31b including a second extending portion 31c and a second extending bottom surface 31d; a semiconductor light-emitting chip 7 having an optical axis X and at least one top electrode 7a mounted on the first mounting portion 30a of the first lead frame 30, the optical axis X thereof being substantially located on an imaginary vertical surface Y of the casing 5, and the at least one top electrode 7a thereof being electrically connected to the second mounting portion 31a of the second lead frame 31 via at least one bonding wire 8; and a lens 3 attached to the casing 5 of the light-emitting body 2 in a light-emitting direction of the light-emitting chip 7.

The casing 5 can include: a front portion 10 having a bottom surface 13, intersecting with the optical axis X of the semiconductor light-emitting chip 7; an upper portion 20 connecting to the front portion 10, and extending in an opposite direction of the light-emitting direction of the light-emitting chip 7; a first side portion 21 having a first inner surface 21a and a first bottom surface 21b, connecting to the front portion 10 and the upper portion 20, and extending in an opposite direction of the upper portion 20: a second side portion 22 having a second inner surface 22a and a second bottom surface 22b, connecting to the front portion 10 and the upper portion 20, extending in the opposite direction of the upper portion 20, and being located in an opposite direction of the first side portion 21, wherein the front portion 10 is located between the first side portion 21 and the second side portion 22; and a second space 25 located between the first side portion 21 and the second side portion 22 and located in an opposite direction of the upper portion 20.

Accordingly, each of the first side portion 21 and the second side portion 22 can project from the front portion 10 in the opposite direction of the upper portion 20. The lens 3 can include: a base plate 40 formed in a planar shape; a cylindrical lens 41 having a top surface 41a and a central axis Z located on or in the base plate 40, the top surface 41a of the cylindrical lens 41 being formed in an arc-like shape as a light-emitting surface of the light-emitting device 1, the central axis Z thereof extending in a horizontal direction of the light-emitting device 1 and intersecting with the substantially optical axis X of the semiconductor light-emitting chip 7 at a substantially right angle; and a pair of projecting portions 42 formed in a stepwise shape, and each of the projecting portions 42 inserted into a respective one of the concave portions 12 of the casing 5 as shown in FIG. 1c.

Figure 2A:
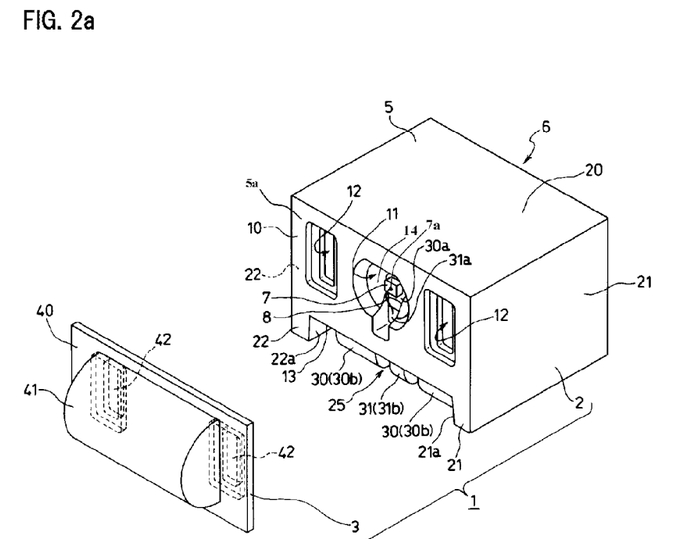
FIG. 2a is an exploded perspective view depicting the surface mount light-emitting device shown in FIG. 1a to FIG. 1c, when a lens is moved from a light-emitting body of the surface mount light-emitting device.
Figure 2B:
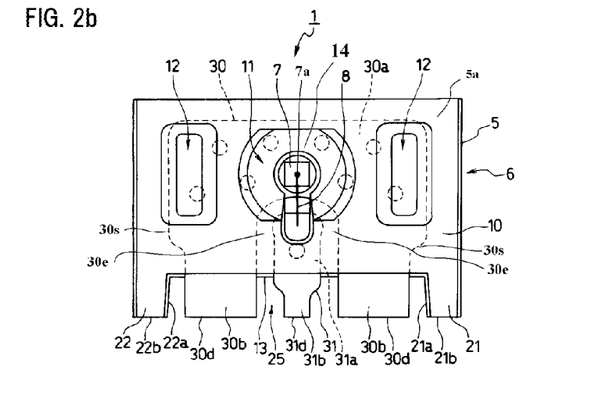
FIG. 2b is an enlarged front view depicting an exemplary embodiment of the light-emitting body of the surface mount light-emitting device.
Figure 2C:
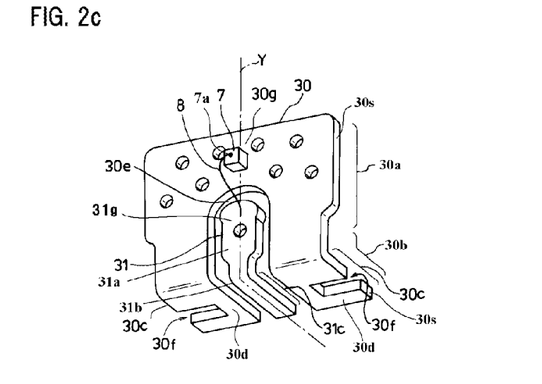
FIG. 2c is an enlarged perspective view depicting an exemplary positional relation of a first lead frame, a second lead frame and a semiconductor light-emitting chip of the surface mount light-emitting device shown in FIG. 1a to FIG. 1c.

Each location of the lens 3, the first lead frame 30 and the second lead frame 31 with respect to the casing 5 will now be described with reference to FIG. 2a to FIG. 2c. FIG. 2a is an exploded perspective view depicting the surface mount light-emitting device 1 when the lens 3 is moved from the light-emitting body 2 of the surface mount light-emitting device 1 shown in FIG. 1a to FIG. 1c, FIG. 2b is an enlarged front view depicting an exemplary embodiment of the light-emitting body 2 of the surface mount light-emitting device 1, and FIG. 2c is an enlarged perspective view depicting an exemplary positional relation of the first lead frame 30, the second lead frame 31 and the semiconductor light-emitting chip 7 of the surface mount light-emitting device 1.

The light-emitting body 2 of the surface mount light-emitting device 1 can include the casing 5 having the pair of concave portions 12 and the cavity 11 located between each of the concave portions 12, which is formed in a stepwise shape. The lens 3 can include the pair of projecting portions 42, which are formed in a stepwise shape. Therefore, the lens 3 can be attached to the light-emitting body 2 with confidence while maintaining at a prescribed position with respect to each other by inserting each of the projecting portions 42 thereof into the respective one of the concave portions 12 of the casing 5.

Each of the first lead frame 30 and the second lead frame 31 can be symmetric with respect to the imaginary vertical surface Y of the casing 5. In this case, each of the lens 3 and the light-emitting body 2 can also be symmetric with respect to the imaginary vertical surface Y. The first lead frame 30 can have a first space 30e, an first outside surface 30s, a first mounting surface 30g and the first mounting portion 30a, which is inserted into the casing 5 and is formed in a substantially planar shape to mount the semiconductor light-emitting chip 7 on the first mounting surface 30g, and the pair of first external portions 30b projecting from the casing 5. The first space 30e can be located between the pair of first external portions 30b, and can also extend toward the first mounting portion 30a of the first lead frame 30 so as to surround the second lead frame 31 in order to locate the second lead frame 31 as shown in FIGS. 2b and 2c.

Each of the pair of first external portions 30b can include the first extending portion 30c, which extends in an opposite direction of the light-emitting direction of the light-emitting device 1 and in a substantially parallel direction with the imaginary vertical surface Y, the first extending bottom surface 30d and the first cutout section 30f, which extends from the first outside surface 30s of the first lead frame 30 in the first extending portion 30c toward the first space 30e. Each of the pair of first external portions 30b can narrow from the outside surface 30s of the first lead frame 30 toward the first space 30e.

Thereby each of the pair of first external portions 30b can easily bended in a process for manufacturing the light-emitting device 1, and also a heat generated from the semiconductor light-emitting chip 7 can efficiently be absorbed by the first mounting portion 30a, which is formed in a relatively large shape, and can efficiently radiate from the pair of first external portions 30b in both outward directions of the light-emitting device 1 with confidence. In addition, each of the pair of first external portions 30b can narrow from both the first space 30e and the first outside surface 30s of the first lead frame 3 in an inward direction of a respective one of the pair of first external portions 30b, and also can narrow from the first space 30e toward the first outside surface 30s of the first lead frame 30, respectively.

In these cases, each width of the first external portions 30b each including the first extending portion 30c can be substantially same with respect to each other, and also each shape of the cutout sections 30f can be substantially same. Additionally, each of the first extending bottom surfaces 30d can be located in a substantially parallel direction with the optical axis X of the light-emitting chip 7, and can be formed in a substantially symmetric shape with respect to each other with reference to the imaginary vertical surface Y of the casing 5, Thereby, when the light-emitting device 1 is mounted on a mounting board, the light-emitting device 1 can enable each of the first extending bottom surfaces 30d to be easily soldered on the mounting board with high positional accuracy because each shape of the first extending bottom surfaces 30d is substantially same in a balanced manner.

The second lead frame 31 can have a first mounting surface 31g to bond the wire bonding 7, which electrically connects the top electrode 7a of the light-emitting chip 7, and the second mounting portion 31a, which is inserted into the casing 5, and also can have the second external portion 31b, which projects from the casing 5. The second external portion 31b can include the second extending portion 31c, which extends in the opposite direction of the light-emitting direction of the light-emitting device 1, and can include the second extending bottom surface 31d, which is located underneath the second extending portion 31c. The second extending bottom surface 31d of the second lead frame 31 can be a substantially same level as the first extending bottom surfaces 30d of the first lead frame 30 so that the first extending bottom surfaces 30d and the second extending bottom surface 31d can be substantially perpendicular to the imaginary vertical surface Y at the same level with respect to each other.

Thereby, when the light-emitting device 1 is mounted on a mounting board, the light-emitting device 1 can enable each of the first lead frame 30 and the second lead frame 31, which can provide a current power supply on the mounting board with the electrodes of the semiconductor light-emitting chip 7, to be easily soldered on the mounting board with high positional accuracy because the first extending bottom surfaces 30d of the first lead frame 30 and the second extending bottom surface 31d become substantially perpendicular to the imaginary vertical surface Y at the same level with respect to each other.

Additionally, because the optical axis X of the semiconductor light-emitting chip 7 passes on the imaginary vertical surface Y and intersects with the central axis Z of the lens 3 at the substantially right angle, the light-emitting device 1 can emit light from the semiconductor light-emitting chip 7 in the substantially parallel direction with the mounting board as the side view type light-emitting device. Therefore, the disclosed subject matter can provide side view type and lead frame type surface mount light-emitting devices having a high reliability, which is easy to be mounted on a mounting board with high positional accuracy, and which can enjoy a high radiation performance.

Figure 3:
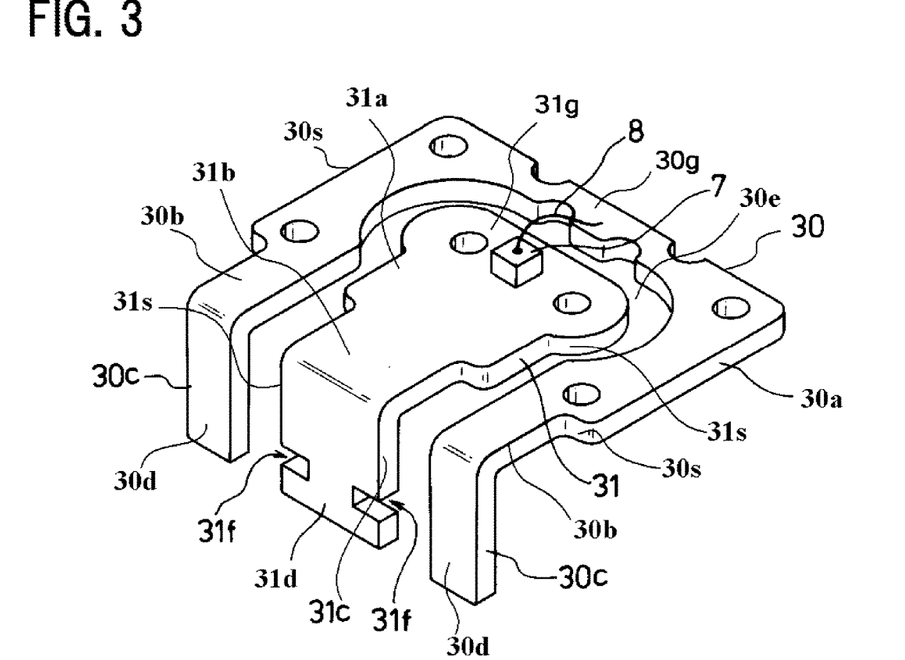
FIG. 3 is an enlarged perspective view depicting an exemplary variation of the first lead frame and the second lead frame of the surface mount light-emitting device including the semiconductor light-emitting chip.

Next, an exemplary variation of the first lead frame 30 and the second lead frame 31 will now be described with reference to FIG. 3. A big difference between the exemplary variation and the above-described first and the second lead frames 30 and 31 relates to a mounting location of the semiconductor light-emitting chip 7. In the exemplary variation of the first and the second lead frames 30 and 31, the semiconductor light-emitting chip 7 having a top electrode and a bottom electrode can be mounted on the second mounting surface 31a of the second lead frame 31 via a conductive adhesive material while the bottom electrode thereof is electrically connected to the second lead frame 31. The top electrode of the semiconductor light-emitting chip 7 can be electrically connected to the first mounting surface 30a of the first lead frame 30 via the bonding wire 8 in contradiction to the above-described embodiment.

In this case, each of the first lead frame 30 and the second lead frame 31 can be substantially symmetric with respect to the imaginary vertical surface Y of the casing 5 while each of the lens 3 and the light-emitting body 2 is substantially symmetric with respect to the imaginary vertical surface Y. Additionally, each of the pair of first external portions 30b can include the first extending portion 30c, which extends in the opposite direction of the light-emitting direction of the light-emitting device 1 and in the substantially parallel direction with the imaginary vertical surface Y, and can include the first extending bottom surface 30d, which broadens from the first outside surface 30s of the first lead frame 30 in the first extending portion 30c toward the first space 30e. Each of the pair of first external portions 30b can narrow from the outside surface 30s of the first lead frame 30 toward the first space 30e without the first cutout section 30f.

On the other hands, the second lead frame 31 can include the second mounting portion 31 have the second mounting surface 31g, which is larger than that of the above-described embodiment to efficiently absorb a heat generated from the semiconductor light-emitting chip 7, and also can include the second external portion 31b projecting from the casing 5, which is wider than that of the above-described embodiment to efficiently radiate the heat from the second extending portion 31c. The second extending portion 31c can extend in the opposite direction of the light-emitting direction of the light-emitting device 1 so that the imaginary vertical surface Y passes though the second extending portion 31c, and can include a pair of cutout sections 31f that extend from both directions of a second outside surface 31s toward an inner direction of the second extending portion 31c so as to face with respect to each other, and also can include the second extending bottom surface 31d, which is located underneath the second extending portion 31c.

In this case, the second extending bottom surface 31d of the second lead frame 31 can be a substantially same level as the first extending bottom surfaces 30d of the first lead frame 30 so that the first extending bottom surfaces 30d and the second extending bottom surface 31d can be substantially perpendicular to the imaginary vertical surface Y at the same level with respect to each other. Each of the pair of first external portions 30b can narrow from the outside surface 30s of the first lead frame 30 toward the first space 30e. Additionally, each of the pair of first external portions 30b can narrow from the first space 30e toward the first outside surface 30s of the first lead frame 30, and also narrow from both the first space 30e and the first outside surface 30s of the first lead frame 3 in the inward direction of a respective one of the pair of first external portions 30b, respectively.

Accordingly, each of the pair of first external portions 30b can easily bended in a process for manufacturing the light-emitting device 1, and also a heat from generated from the semiconductor light-emitting chip 7 can efficiently be absorbed by the second mounting portion 31a, which is formed in a relatively large shape, and can efficiently radiate from the second external portions 30b in an outward directions of the light-emitting device 1 with confidence. When the light-emitting device 1 using the above-described variation of the first and the second lead frames 30 and 31 is mounted on a mounting board, the light-emitting device 1 can enable each of the first extending bottom surfaces 30d and the second bottom surfaces 31d to be easily soldered on the mounting board with high positional accuracy because each shape of the first extending bottom surfaces 30d, which are located in both directions of the second extending bottom surface 31d, is substantially same in a balanced manner.

Moreover, because the optical axis X of the semiconductor light-emitting chip 7 can intersect with the central axis Z of the lens 3 at the substantially right angle while passing on the imaginary vertical surface Y, the light-emitting device 1 using the above-described variation can also emit light from the semiconductor light-emitting chip 7 in the substantially parallel direction with the mounting board as the side view type light-emitting device. Accordingly, the disclosed subject matter can provide side view type and lead frame type surface mount light-emitting devices having a high reliability, which can be easily mounted on a mounting board with high positional accuracy, and which can maintains a high radiation performance, even when the semiconductor light-emitting chip 7 is mounted on the second lead frame 31.

Here, an exemplary method for manufacturing the semiconductor light-emitting device 1 will now be described. As each of the first lead frame 30 and the second lead frame 31, a metallic plate having a high thermal conductivity, which is made by plating a metallic plate such as aluminum, aluminum alloy, copper, copper alloy and the like with gold, silver, etc., can be used. When a width of the second extending portion 31*c* is, for example, approximately 0.3 millimeters, a width of the first space 30*e* can be approximately 0.3 millimeters in common with the width of the first second extending portion 31*c* and a width of the first extending portion 30*c* can be more than 0.6 millimeters, which is more than double for the width of the first second extending portion 31*c*.

In addition, each width of the cutout sections 30*f* in a direction of the optical axis X of the light-emitting chip 7 can be approximately 0.5 millimeters, which is wider than the width of the first second extending portion 31*c*, in order to perfectly form fine solder fillets 60*c* as described later with reference to FIG. 5*b*. As the casting resin of the casing 5, a resin such as an acrylic resin, a polyethylene resin, a polycarbonate resin and the like can be employed. The lens 3 can be made by casting a transparent material such as an epoxy resin, a silicone resin, etc.

When the light-emitting body 2 of the side view and lead frame type is manufactured, an insert molding method can be employed by inserting the multiple first lead frame and the multiple second lead frame into a mold tool, which molds a multiple casing to improve productivity in processes for manufacturing the light-emitting body 2. The light-emitting body 2 can be accomplished by cutting each of the first lead frame 30 and the second lead frame 31 from the multiple casing and bending them in the above-described shape and by bonding the semiconductor light-emitting chip 7 on either the first lead frame 30 or the second lead frame 31 as described above.

When the semiconductor light-emitting chip 7 has the top electrode and the bottom electrode, the bottom electrode of the chip 7 can be electrically connected to one of the first lead frame 30 and the second lead frame 31 in parallel with mounting the light-emitting chip 7 via the conductive adhesive material, and the top electrode of the chip 7 can be electrically connected to another one of the first lead frame 30 and the second lead frame 31 via the bonding wire 8. When the semiconductor light-emitting chip 7 has two top electrodes without the bottom electrode, another top electrode can be electrically connected to the one of the first lead frame 30 and the second lead frame 31 via another bonding wire 8 after bonding the light-emitting chip 7 on the one of the first lead frame 30 and the second lead frame 31 via an adhesive material.

Figure 4A:
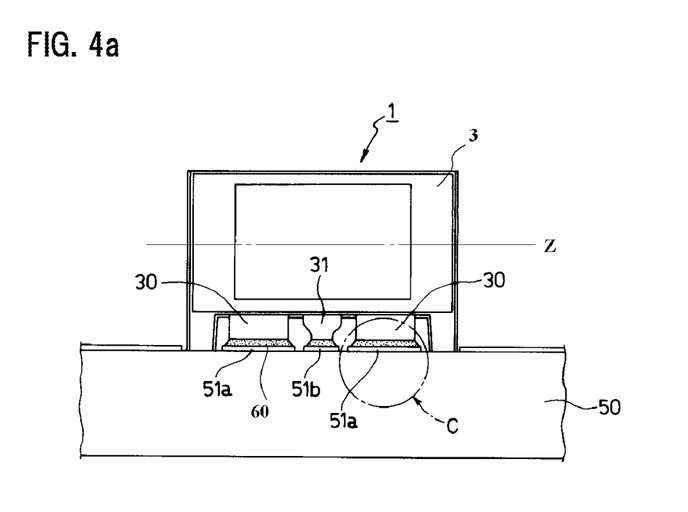
FIG. 4a is an enlarged front view depicting the semiconductor light-emitting device mounted on a circuit board.
Figure 4B:
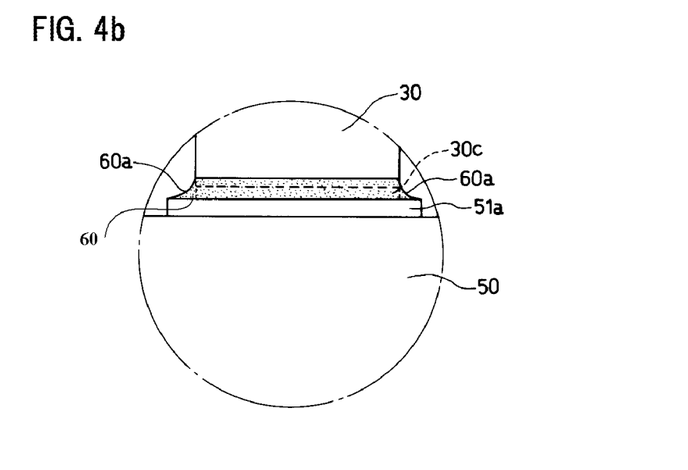

As a result, the light-emitting body 2 can be accomplished, and the semiconductor light-emitting device 1 of the side view and lead frame type can be finished by attaching the lens to the light-emitting body 2. FIG. 4*a* is an enlarged front view depicting the semiconductor light-emitting device 1 mounted on a circuit board 50 having a pair of first conductor patterns 51*a* and a second conductor pattern 51*b* via a solder 60, and FIG. 4*b* is a partial enlarged front view depicting a soldering state between the first lead frame 30 of the light-emitting device 1 and the first conductor pattern 51*a* of the circuit board 50 in Circle C shown in FIG. 4*a*.

Each of the pair of the first conductor patterns 51*a* can be formed in a slightly larger similar shape than a respective one corresponding shape to the pair of first extending bottom surfaces 30*d*, which are located underneath the pair of first extending bottom portions 30*c* each including the cutout section 30*f*. The second conductor pattern 51*b* can also be formed in a slightly larger similar shape than a corresponding shape to the second extending bottom surface 31*d*, which is located underneath the second extending bottom portion 31*c*.

Accordingly, the solder 60 can cover between each of the first conductor patterns 51*a* and the respective one corresponding to the first extending bottom surfaces 30*d* and between the second conductor pattern 51*b* and the second extending bottom surface 21*d*, and also can form fine solder fillets 60*a* between each end of the first conductor patterns 51*a* and the second conductor pattern 51*b* and a respective one corresponding end of the first extending bottom surfaces 30*d* and the second extending bottom surface 31*d*. Therefore, the light-emitting device 1 can be mounted on the circuit board 50 with confidence at the prescribed position in a substantially parallel direction with the central axis Z of the lens 3.

Figure 5A:
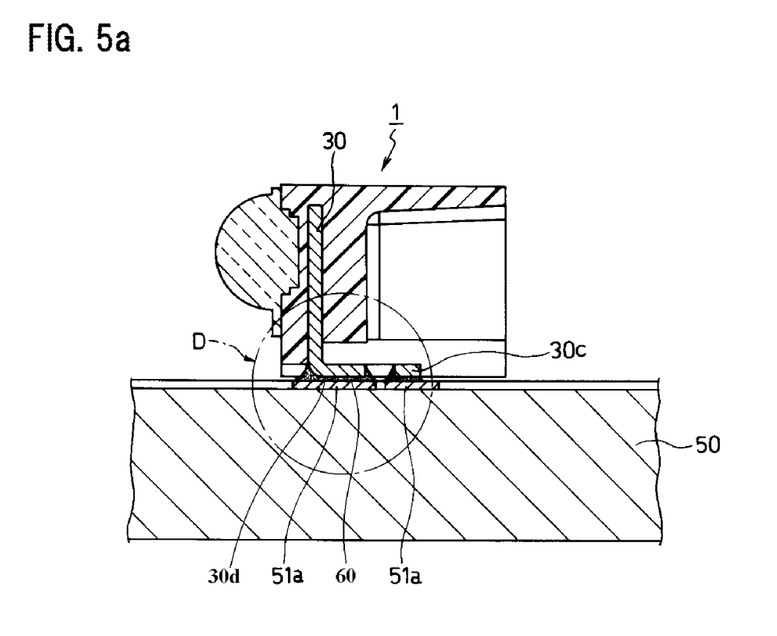
FIG. 5a is an enlarged side cross-sectional view depicting the semiconductor light-emitting device mounted on the circuit board.
Figure 5B:
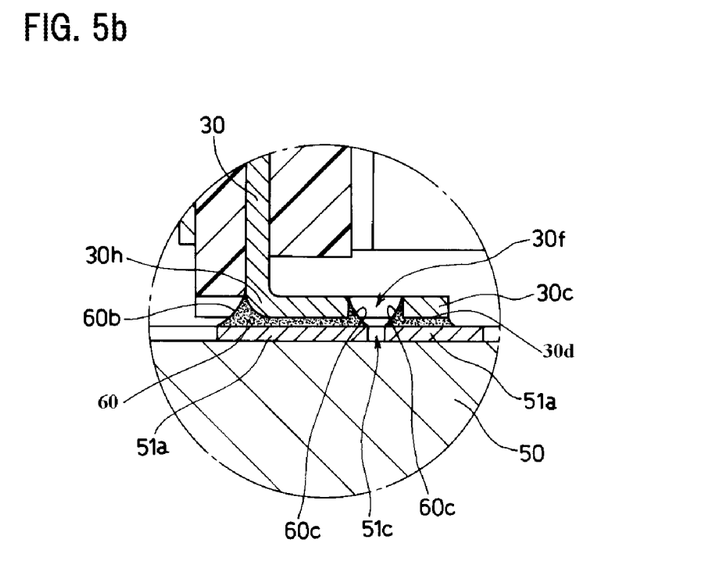

FIG. 5*a* is an enlarged side cross-sectional view depicting the semiconductor light-emitting device 1 mounted on the circuit board 50, and FIG. 5*b* is a partial enlarged side cross-sectional view depicting a soldering state between the first lead frame 30 of the light-emitting device 1 and the first conductor pattern 51*a* of the circuit board 50 in Circle D shown in FIG. 5*a*. The above-described solder 60 can cover between each of the first conductor patterns 51*a* and the respective one corresponding to the first extending bottom surfaces 30*d* and between the second conductor pattern 51*b* and the second extending bottom surface 21*d* in the direction toward the optical axis X of the light-emitting chip 7, and also can form fine solder fillets 60*b* between each end of the first conductor patterns 51*a* and the second conductor pattern 51*b* and a respective one corresponding end of the first extending bottom surfaces 30*d* and the second extending bottom surface 31*d*.

Furthermore, the fine solder fillets 60*c* can also be formed between each top end of the cutout sections 30*f* and a respective one corresponding to patterning cutout sections 51*c* of the first conductor patters 51*a*. Accordingly, the solder 60 can attach the light-emitting device 1 on the circuit board 50 with confidence at the prescribed position in a direction perpendicular to the central axis Z of the lens 3 also. More specifically, when the semiconductor light-emitting device 1 is mounted on the circuit board 50 by an automatic soldering method such as a reflow soldering, a dip soldering and the like, the light-emitting device 1 can enable each of the first lead frame 30 and the second lead frame 31 to move full at the prescribed position of the circuit board 50 by using a self alignment of a surface tension of melting solder, which becomes the solder 60 when solidifying the melting solder, because the respective one of the first extending bottom surfaces 30*d* and the second bottom surface 31 may automatically move on each of the first conductor patterns 51*a* and the second conductor pattern 51*b* and then the melting solder is solidified.

According to the above-described embodiment of the light-emitting device 1, each of the pair of first extending bottom surfaces 30*d* each including the cutout section 30*f* of the first lead frame 30 mounting the light-emitting chip 7 on the first mounting surface 30*g* can be located in the substantially parallel direction with the optical axis X of the light-emitting chip 7, and can be formed in the substantially symmetric shape with respect to each other with reference to the imaginary vertical surface Y of the casing 5. Additionally, the second extending bottom surface 31d located between the pair of first extending bottom surfaces 30d can be also located in the substantially parallel direction with the optical axis X, and can be substantially same level as the first extending bottom surfaces 30d. Therefore, the semiconductor light-emitting device 1 can enable each of the first lead frame 30 and the second lead frame 31 to move full at the prescribed position of the circuit board 50 by using the self alignment of the surface tension of melting solder, and can be mounted on the circuit board 50.

Accordingly, the surface mount light-emitting devices 1 can be easily mounted on the mounting board with high positional accuracy and also can emit light having a high light-emitting intensity using a high brightness chip in a substantially parallel direction to the mounting board. Even high heat generated from the high brightness chip mounted on a middle portion of the first mounting portion 30a can efficiently radiate via the pair of first extending bottom surfaces 30d from the circuit board 50. Thereby, the semiconductor light-emitting device 1 can maintain a high reliability and a high light-emitting intensity because degradations of a lift and a light-emitting efficiency of the device, which are caused by a temperature increase of the light-emitting chip 7, can be inhibited with confidence.

Thus, the disclosed subject matter can provide side view type and lead frame type surface mount light-emitting devices having high reliability, which is easy to be mounted on a mounting board with high positional accuracy, and which can enjoy a high radiation performance. In addition, even when the surface mount light-emitting devices 1 uses the exemplary variation of the first lead frame 30 and the second lead frames 31 mounting the light-emitting chip 7 on the second mounting surface 31g shown in FIG. 3, the disclosed subject matter can provide side view type and lead frame type surface mount light-emitting devices having high reliability, which is easy to be mounted on a mounting board with high positional accuracy, and which can enjoy a high radiation performance, because of the above-described same and similar reasons.

Figure 6A:
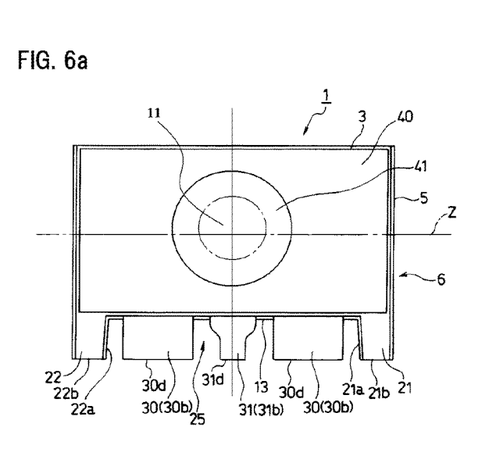
FIGS. 6a and 6b are an enlarged front view and an enlarged side view showing the semiconductor light-emitting device including an exemplary variation of the lens made in accordance with principles of the disclosed subject matter.
Figure 6B:
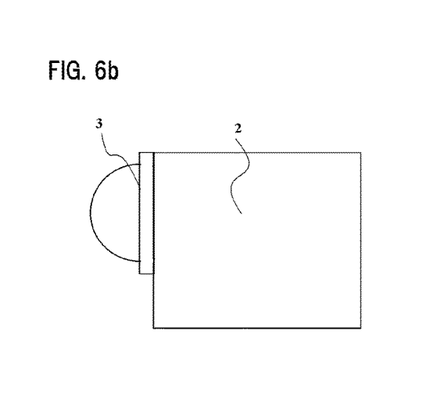
Figure 6C:
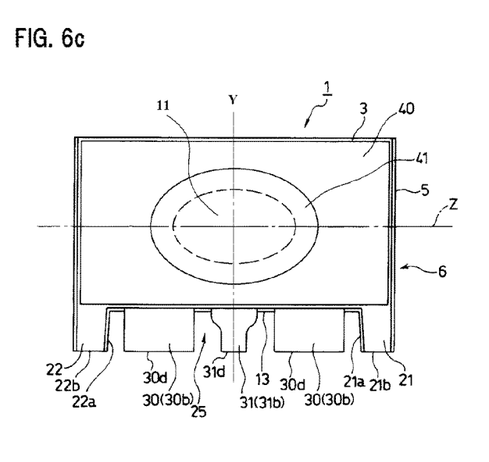
FIGS. 6c and 6d are an enlarged front view and an enlarged side view showing the semiconductor light-emitting device including another exemplary variation of the lens.
Figure 6D:
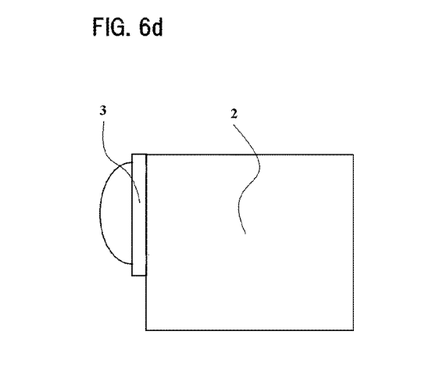
Figure 7A:
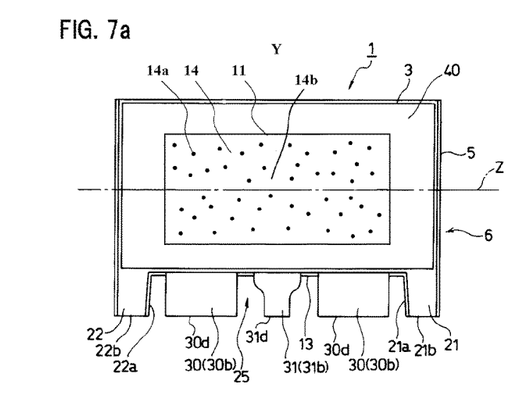
FIGS. 7a and 7b are an enlarged front view and an enlarged side view showing an exemplary variation of a semiconductor light-emitting device not including the lens made in accordance with principles of the disclosed subject matter.
Figure 7B:
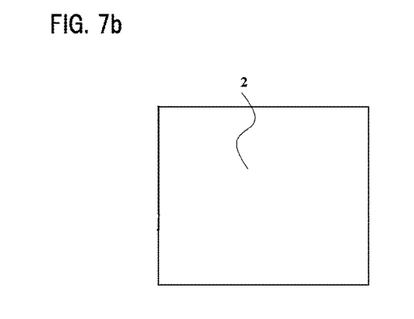
Figure 7C:
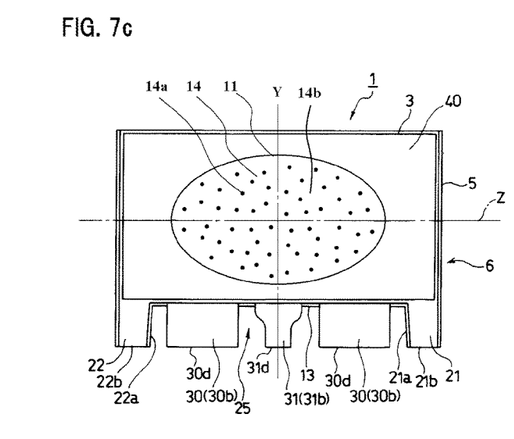
FIGS. 7c and 7d are an enlarged front view and an enlarged side view showing another exemplary variation of the semiconductor light-emitting device not including the lens.
Figure 7D:
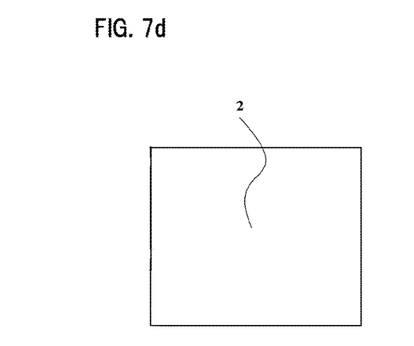

Moreover, the lens 3 cannot be limited to the cylindrical lens as shown in FIG. 2a. A circular lens can be used as the lens 3 as shown in FIGS. 6a and 6b, and an ellipsoidal lens can also be used as the lens 3 to match optical characteristics of the light-emitting device 1 in accordance with various usages. In these cases, each of shapes of the cavities 11 can also be varied to match the optical characteristics of the semiconductor light-emitting device 1 in common with the lens 3.

In addition, in order to protect the light-emitting chip 7 and the bonding wire 8 from vibrations, etc. the encapsulating resin 14 made of a transparent resin such as an epoxy resin, a silicone resin and the like can encapsulate the light-emitting chip 7 and the bonding wire 8 in the cavity 11 of the casing 5. Thereby, the light-emitting device 1 can also be composed of only the light-emitting body 2 by removing the lens 3 from the light-emitting device 1 so that a top surface 14b of the encapsulating resin 14 becomes a light-emitting surface of the device as shown in FIG. 7a to FIG. 7d. As the semiconductor light-emitting chip 7, various light-emitting chips such as a red light-emitting diode (LED), a green LED, a blue LED, an amber LED, an ultraviolet LED, a laser diode and the like can be used.

The encapsulating resin 14 can include at least one phosphor 14a of a yellow phosphor such as $Y_3Al_5O_{12}:Ce^{3+}$ (YAG) and the like, a red phosphor such as $CaAlSiN_3:Eu^{2+}$ and the like, a green phosphor such as $(Ga, Y_3Al)_5O_{12}:Ce^{3+}$ and the like, and a blue phosphor such as $BaMgAl_{10}O_{17}$: $Eu^{2+}$, etc. For example, when the encapsulating resin includes the yellow phosphor and the light-emitting chip 7 is a blue LED chip emitting blue light, the semiconductor light-emitting device 1 can emit substantially white light by an additive color mixture of yellow light excited by a part of blue light emitted from the blue LED chip and another part of the blue light.

Moreover, when the encapsulating resin includes the red phosphor, the green phosphor and the blue phosphor and when the light-emitting chip 7 is an ultraviolet LED emitting ultraviolet light, the semiconductor light-emitting device 1 can emit light having various color tones by varying a combination of the above-described phosphors, and/or by varying a density ration of the combination of the phosphors in accordance with a variety of usages. Thus, the disclosed subject matter can also include providing reliable side view and lead frame type surface mount light-emitting devices have high radiation performance even when emitting the various color lights having the high light-emitting intensity. Because the combination of the phosphors and light-emitting chip is disclosed in Patent Documents No. 2 and No. 3, which are owned by Applicant of this disclosed subject matter, details are abbreviated here.

As described above, the reliable semiconductor light-emitting device 1 of the side view and lead frame type can emit various colored lights having a high light-emitting intensity by combining the semiconductor light-emitting chip 7 with the encapsulating resin 14 including the at least one phosphor 14a, and therefore can also be used as a light source device for various applications such as LCD back light units, vehicle lamp lighting, general lighting, a street light, stage lighting, etc. Moreover, it is conceived that each of the different aspects and features of the different embodiments disclosed herein could be used interchangeably in and with the other disclosed embodiments. Furthermore, each of the specifically referenced features of each of the disclosed embodiments can be interchanged with each other in the various embodiments in all possible combinations of the referenced features.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A surface mount light-emitting device, comprising:
   a casing having a front surface and a cavity being concave from the front surface, made of a casting resin and including an imaginary vertical surface;
   a semiconductor light-emitting chip having an optical axis and at least one top electrode, and the optical axis of the semiconductor light-emitting chip substantially located on the imaginary vertical surface of the casing;
   a first lead frame having a first mounting portion inserted into the casing, a pair of first external portions projecting from the casing, a space and a first outer side surface, the first mounting portion including a first mounting surface exposed from the cavity of the casing, the first mounting surface of the first mounting portion mounting the semiconductor light-emitting chip on the first mounting surface, intersecting the optical axis of the semiconductor light-emitting chip at a substantially right angle, and also intersecting the imaginary vertical surface of the casing at a substantially right angle, the pair of first external portions each including a first extending portion, a first extending bottom surface located underneath the first extending portion and a first cutout section included in each of the first extending portions, and each of the first extending bottom surfaces being located in a substantially parallel direction with the optical axis of the semiconductor light-emitting chip and in an opposite direction of a light-emitting direction of the semiconductor light-emitting device, and being formed in a substantially symmetric shape with respect to each other with reference to the imaginary vertical surface of the casing;

a second lead frame having a second mounting portion inserted into the casing and a second external portions projecting from the casing, the second mounting portion including a second mounting surface exposed from the cavity of the casing, the second mounting surface of the second mounting portion being electrically connected to the top electrode of the semiconductor light-emitting chip via a bonding wire, the second external portion of the second lead frame including a second extending portion and a second extending bottom surface located underneath the second extending portion, and the second extending bottom surface being located in the substantially parallel direction with the optical axis of the semiconductor light-emitting chip and in the opposite direction of the light-emitting direction of the semiconductor light emitting device, and being substantially same level as the first extending bottom surfaces of the first lead frame, and wherein the space of the first lead frame is continuously located between the first mounting portion of the first lead frame and the second mounting portion of the second lead frame and between the first external portion of the first lead frame and the second external portion of the second lead frame; and a lens having a central axis being located adjacent the front surface of the casing, the central axis of the lens intersecting with the optical axis of the semiconductor light-emitting chip at a substantially right angle, and extending in a direction substantially perpendicular to the imaginary vertical surface of the casing, wherein the lens includes a pair of projecting portions that project toward the casing, the casing also includes a pair of concave portions from the front surface of the casing in which the cavity is located between the pair of concave portions, and each of the pair of projecting portion of the lens is inserted into a respective one of the pair of concave portions of the casing.

2. The surface mount light-emitting device according to claim 1, wherein the lens includes a cylindrical lens having the central axis.

3. The surface mount light-emitting device according to claim 1, wherein each of the first lead frame and the second lead frame is substantially symmetric with respect to the imaginary vertical surface of the casing.

4. The surface mount light-emitting device according to claim 1, wherein each of the first extending portions of the first lead frame narrows from the first outer side surface of the first mounting portion of the first lead frame toward the space.

5. The surface mount light-emitting device according to claim 1, further comprising:
an encapsulating resin encapsulating the semiconductor light-emitting chip and the bonding wire in the cavity.

6. The surface mount light-emitting device according to claim 5, wherein the encapsulating resin includes at least one of a red phosphor, a green phosphor, a blue phosphor and a yellow phosphor.

7. A surface mount light-emitting device, comprising:
a casing having a front surface and a cavity being concave from the front surface, made of a casting resin and including an imaginary vertical surface;

a semiconductor light-emitting chip having an optical axis and at least one top electrode, and the optical axis of the semiconductor light-emitting chip substantially located on the imaginary vertical surface of the casing;

a first lead frame having a first mounting portion inserted into the casing, a pair of first external portions projecting from the casing, a space and a first outer side surface, the first mounting portion including a first mounting surface exposed from the cavity of the casing, the first mounting surface of the first mounting portion mounting the semiconductor light-emitting chip on the first mounting surface, intersecting the optical axis of the semiconductor light-emitting chip at a substantially right angle, and also intersecting the imaginary vertical surface of the casing at a substantially right angle, the pair of first external portions each including a first extending portion, a first extending bottom surface located underneath the first extending portion and a first cutout section included in each of the first extending portions, and each of the first extending bottom surfaces being located in a substantially parallel direction with the optical axis of the semiconductor light-emitting chip and in an opposite direction of a light-emitting direction of the semiconductor light-emitting device, and being formed in a substantially symmetric shape with respect to each other with reference to the imaginary vertical surface of the casing;

a second lead frame having a second mounting portion inserted into the casing and a second external portions projecting from the casing, the second mounting portion including a second mounting surface exposed from the cavity of the casing, the second mounting surface of the second mounting portion being electrically connected to the top electrode of the semiconductor light-emitting chip via a bonding wire, the second external portion of the second lead frame including a second extending portion and a second extending bottom surface located underneath the second extending portion, and the second extending bottom surface being located in the substantially parallel direction with the optical axis of the semiconductor light-emitting chip and in the opposite direction of the light-emitting direction of the semiconductor light emitting device, and being substantially same level as the first extending bottom surfaces of the first lead frame, and wherein the space of the first lead frame is continuously located between the first mounting portion of the first lead frame and the second mounting portion of the second lead frame and between the first external portion of the first lead frame and the second external portion of the second lead frame;

a lens having a central axis being located adjacent the front surface of the casing, the central axis of the lens intersecting with the optical axis of the semiconductor light-emitting chip at a substantially right angle, and extending in a direction substantially perpendicular to the imaginary vertical surface of the casing; and wherein each of the first lead frame and the second lead frame includes at least one hole, and the casting resin of the casing is inserted into the at least one hole of each of the first lead frame and the second lead frame.

8. The surface mount light-emitting device according to claim 7, wherein the lens includes a cylindrical lens having the central axis.

9. The surface mount light-emitting device according to claim 7, wherein each of the first lead frame and the second lead frame is substantially symmetric with respect to the imaginary vertical surface of the casing.

10. The surface mount light-emitting device according to claim 7, wherein each of the first extending portions of the first lead frame narrows from the first outer side surface of the first mounting portion of the first lead frame toward the space.

11. The surface mount light-emitting device according to claim 7, further comprising:
an encapsulating resin encapsulating the semiconductor light-emitting chip and the bonding wire in the cavity.

12. The surface mount light-emitting device according to claim 10, wherein the encapsulating resin includes at least one of a red phosphor, a green phosphor, a blue phosphor and a yellow phosphor.

\* \* \* \* \*